(12) United States Patent
Chang et al.

(10) Patent No.: US 9,396,769 B1
(45) Date of Patent: Jul. 19, 2016

(54) MEMORY DEVICE AND OPERATING METHOD OF SAME

(71) Applicant: Macronix International Co., Ltd., Hsinchu (TW)

(72) Inventors: Kuen-Long Chang, Taipei (TW); Ken-Hui Chen, Hsinchu (TW); Ming-Chih Hsieh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/619,810

(22) Filed: Feb. 11, 2015

(51) Int. Cl.
*G11C 7/00* (2006.01)
(52) U.S. Cl.
CPC ........................................ *G11C 7/00* (2013.01)
(58) Field of Classification Search
CPC .... G11C 16/0483; G11C 16/08; G11C 17/18; G11C 2207/063; G11C 29/789; G11C 5/025; G11C 7/062; G11C 7/067; G11C 7/18; G11C 8/08; G11C 8/10; G11C 16/10; G11C 11/5642; G11C 29/808; G11C 8/12; G11C 16/0475
USPC ............ 365/185.05, 230.06, 185.03, 51, 365/230.03, 185.01, 185.09, 185.17, 365/185.21, 185.22, 200, 230.01, 230.04, 365/230.05, 235, 236, 53
See application file for complete search history.

(56) References Cited

U.S. PATENT DOCUMENTS

2013/0077401 A1\* 3/2013 Kono ..................... G11C 16/08
365/185.05

\* cited by examiner

*Primary Examiner* — Thong Q Le
(74) *Attorney, Agent, or Firm* — Finnegan, Henderson, Farabow, Garrett & Dunner LLP

(57) ABSTRACT

A memory device includes a memory array and a logic unit communicatively coupled to the memory array. The memory array includes a plurality of pages for storing array data and a plurality of extra arrays respectively corresponding to the plurality of pages for storing extra data. The logic unit is configured to receive a read instruction, and perform a read operation in a first access mode or in a second access mode. In the first access mode, the logic unit sequentially reads out the array data stored in the plurality of pages. In the second access mode, the logic unit sequentially reads out the array data stored in the plurality of pages and the extra data stored in the plurality of extra arrays.

19 Claims, 10 Drawing Sheets

| 1st byte | 2nd byte | 3rd byte | 4th byte |
|---|---|---|---|
| Command Code | AD1 (A23-A16) | AD2 (A15-A8) | AD3 (A7-A0) |

FIG. 4

| 1st byte | 2nd byte | 3rd byte | 4th byte | 5th byte |
|---|---|---|---|---|
| Command Code | AD1 (A23-A16) | AD2 (A15-A8) | AD3 (A7-A0) | Dummy byte |

FIG. 5

| 1st byte | 2nd byte | 3rd byte | 4th byte | 5th byte | ... | 260th byte |
|---|---|---|---|---|---|---|
| Command Code | AD1 (A23-A16) | AD2 (A15-A8) | AD3 (A7-A0) | 1st byte array data | ... | 256th byte array data |

| 1st byte | 2nd byte | 3rd byte | 4th byte | 5th byte | ... | 260th byte | 261st byte | ... | 268th byte |
|---|---|---|---|---|---|---|---|---|---|
| Command Code | AD1 (A23-A16) | AD2 (A15-A8) | AD3 (A7-A0) | 1st byte array data | ... | 256th byte array data | 1st byte Extra array data | ... | 8th byte Extra array data |

| 1st byte | 2nd byte | 3rd byte | 4th byte |
|---|---|---|---|
| Command Code | AD1 (A23-A16) | AD2 (A15-A8) | AD3 (A7-A0) |

FIG. 11

MEMORY DEVICE AND OPERATING METHOD OF SAME

FIELD OF THE DISCLOSURE

The present disclosure relates to a memory device and operation method of the same and, more particularly, to a memory device having extra arrays of reconfigurable size.

BACKGROUND

Memory devices are used in a variety of electronic applications. A memory device may include a plurality of pages for storing user data, and the size of the pages is fixed and unchangeable. However, in some applications, it is desirable to store extra data in the memory device.

SUMMARY

According to an embodiment of the disclosure, a memory device includes a memory array including a plurality of pages for storing array data and a plurality of extra arrays respectively corresponding to the plurality of pages for storing extra data. The memory device also includes a logic unit communicatively coupled to the memory array and configured to receive a read instruction, and perform a read operation in a first access mode or in a second access mode. In the first access mode, the logic unit sequentially reads out the array data stored in the plurality of pages. In the second access mode, the logic unit sequentially reads out the array data stored in the plurality of pages and the extra data stored in the plurality of extra arrays.

According to another embodiment of the disclosure, a memory device includes a memory array including a plurality of pages for storing array data and a plurality of extra arrays respectively corresponding to the plurality of pages for storing extra data. The memory device also includes a logic unit communicatively coupled to the memory array, and configured to receive a program instruction including an address of a selected page and data to be programmed, and perform a program operation in a first access mode or in a second access mode. In the first access mode, the logic unit programs the received data in the selected page. In the second access mode, the logic unit programs the received data in the selected page and the extra array corresponding to the selected page.

According to a further embodiment of the disclosure, a method of operating a memory device is provided. The memory device includes a plurality of array blocks for storing array data and a plurality of extra array blocks respectively corresponding to the plurality of array blocks for storing extra data. The method includes receiving a read instruction including a read command code, and determining whether the read command code is a first read command code or a second read command code. If the read command code is determined to be the first read command code, the method includes sequentially reading out the array data stored in the plurality of pages. If the read command code is determined to be the second read command code, the method includes sequentially reading out the array data stored in the plurality of pages and the extra data stored in the plurality of extra arrays.

The accompanying drawings, which are incorporated in and constitute a part of this specification, illustrate disclosed embodiments and, together with the description, serve to explain the disclosed embodiments.

BRIEF DESCRIPTION OF THE DRAWINGS

FIG. 4 schematically illustrates a read instruction for performing a read operation, according to an illustrated embodiment.

FIG. 5 schematically illustrates a fast read instruction for performing a fast read operation, according to an illustrated embodiment.

FIG. 8A schematically illustrates a page program instruction for performing a page program operation in the first access mode, according to an illustrated embodiment.

FIG. 8B schematically illustrates a page program instruction for performing a page program operation in the second access mode, according to an illustrated embodiment.

FIG. 11 schematically illustrates an erase instruction for performing an erase operation, according to an embodiment.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
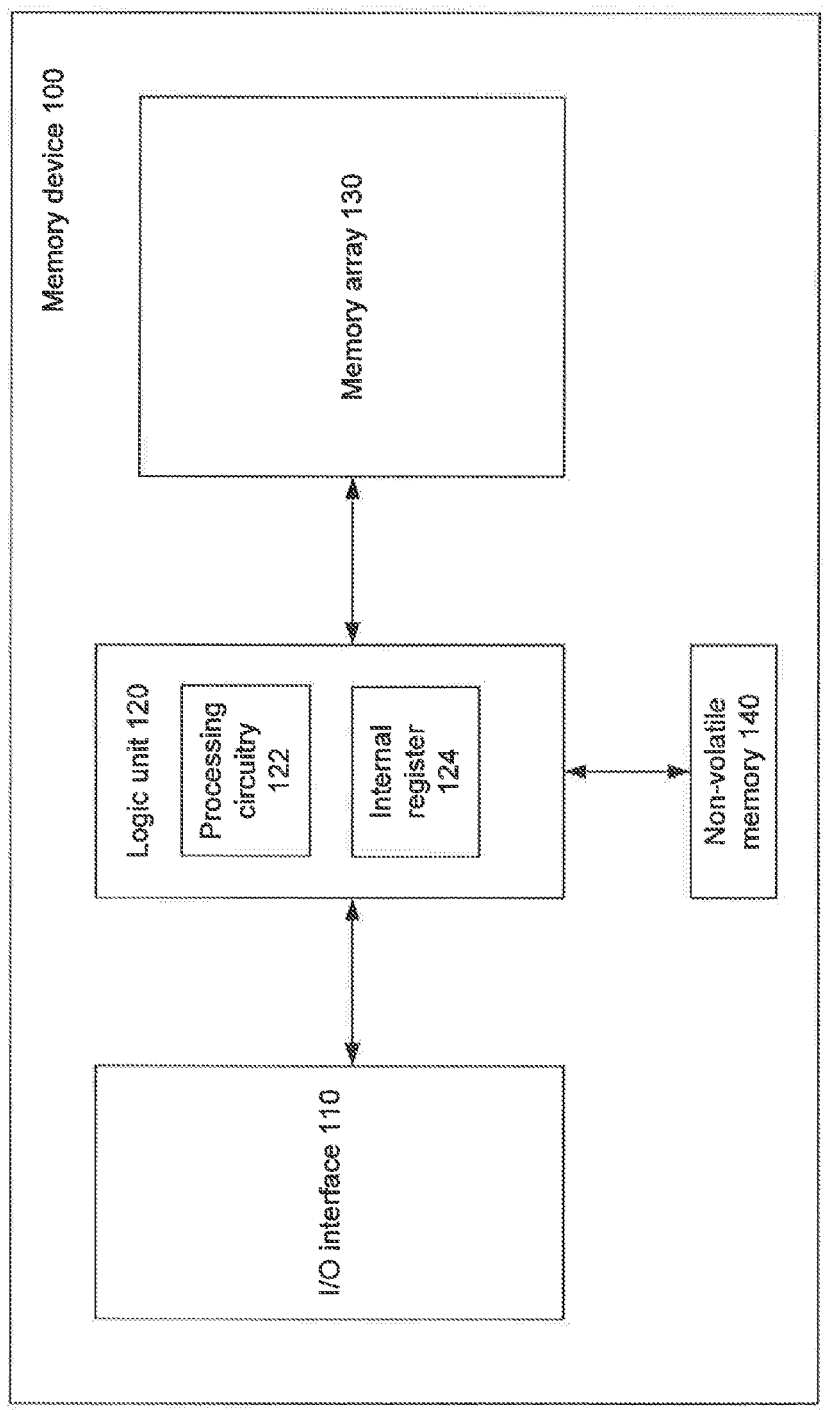
FIG. 1 schematically illustrates a memory device having extra arrays of reconfigurable size, according to an illustrated embodiment.

FIG. 1 schematically illustrates a memory device 100 having extra arrays of reconfigurable size, according to an illustrated embodiment. Memory device 100 includes an input/output (I/O) interface 110, a logic unit 120 communicatively coupled to I/O interface 110, a memory array 130 communicatively coupled to logic unit 120, and a non-volatile memory 140 communicatively coupled to logic unit 120. I/O interface 110 includes a plurality of pins (not shown) coupled to an external circuit (not shown). I/O interface 110 receives various instructions and data to be programmed, i.e., written, into memory array 130 from the external circuit. I/O interface 110 also outputs data read from memory array 130 to the external circuit. Logic unit 120 receives the instructions and the data from I/O interface 110, and performs various operations (e.g., read, program, erase, etc.) on memory array 130 according to the received instructions. Logic unit 120 includes processing circuitry 122 and an internal register 124. Processing circuitry 122 includes logic circuits that control the overall operation of logic unit 120. Internal register 124 stores temporary data used by processing circuitry 122. Internal register 124 can be implemented by a volatile memory, such as a static random-access memory (SRAM), a random-access memory (RAM), and a dynamic random-access memory (DRAM). Non-volatile memory 140 stores permanent data used by processing circuitry 122. Non-volatile memory 140 also stores information about chip configuration for memory device 100. Non-volatile memory 140 can be implemented by a flash memory, a read-only memory (ROM), a ferroelectric random-access memory (F-RAM), a magnetic computer storage device, or an optical disc. Memory array 130 is a non-volatile memory such as a flash memory, a read-only memory (ROM), a ferroelectric random-access memory (F-RAM), a magnetic computer storage device, or an optical disc.

In some embodiments, internal register 124 of logic unit 120 stores a plurality of command codes and their corresponding operations. When logic unit 120 receives an instruction from the external circuit via I/O interface 110, processing circuitry 122 of logic unit 120 parses the instruction to identify a command code, compares the identified command code with the plurality of command codes stored in internal register 124 to look for an operation corresponding to the identified command code, and then performs the operation.

Figure 2:
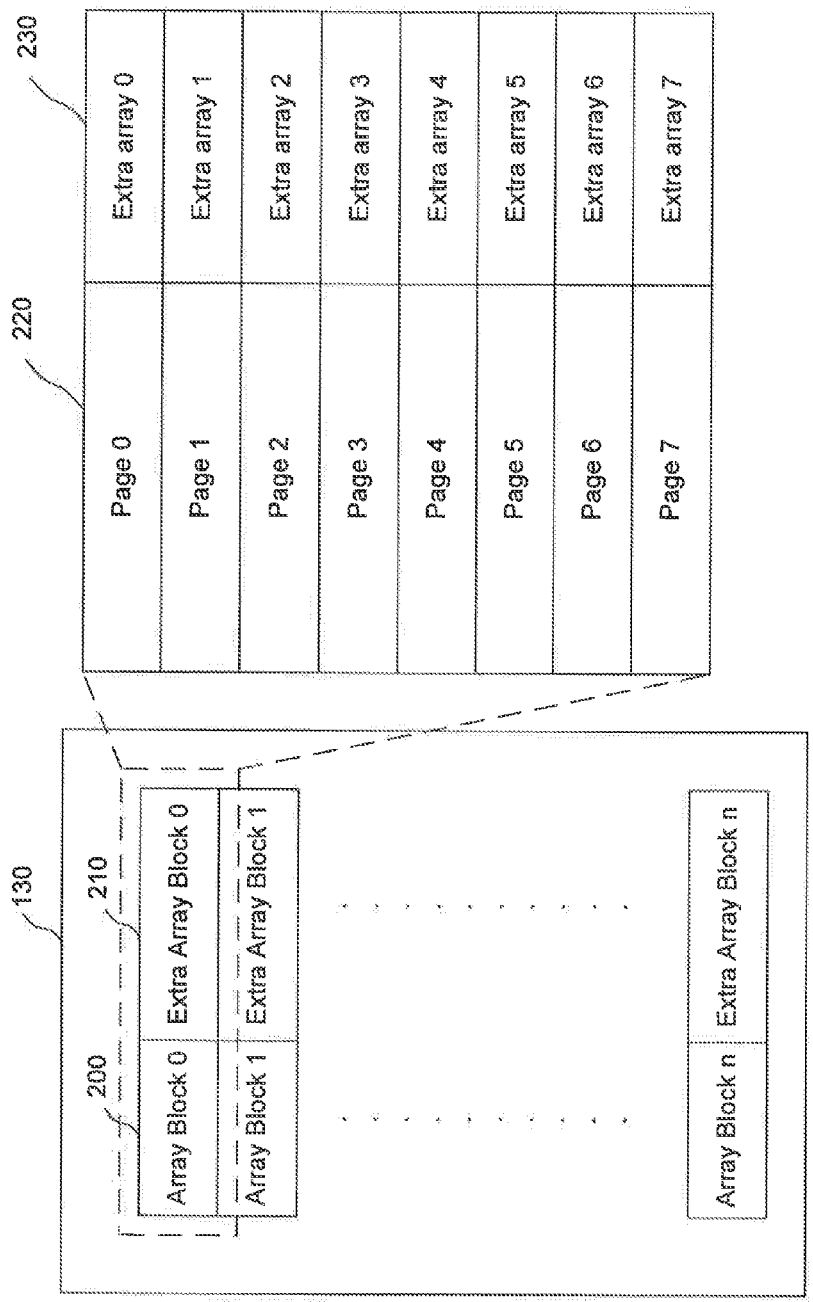
FIG. 2 schematically illustrates an array structure of a memory array, according to an illustrated embodiment.

FIG. 2 schematically illustrates an array structure of memory array 130, according to an illustrated embodiment. Memory array 130 includes a plurality of array blocks 200 and a plurality of extra array blocks 210. Each extra array block 210 corresponds to one of the plurality of array blocks 200. That is, extra array block 0 corresponds to array block 0, extra array block 1 corresponds to array block 1, . . . , and extra array block n corresponds to array block n. Each array block 200 includes a plurality of, e.g., eight (8), pages 220. Each extra array block 210 includes a plurality of, e.g., eight (8), extra arrays 230. Each extra array 230 corresponds to one of the plurality of pages 220. That is, extra array 0 corresponds to page 0, extra array 1 corresponds to page 1, . . . , and extra array 7 corresponds to page 7. Each page 220 has a fixed size of, e.g., 256 bytes. Each extra array 230 has a reconfigurable size of, e.g., 1 byte, 2 bytes, or 8 bytes, etc. The plurality of pages 220 are used to store the array data defined by the user. The plurality of extra arrays 230 are used to store extra data associated with the array data stored in the corresponding pages 220. For example, the extra data stored in extra array 0 includes Error Checking and Correcting (ECC) code, and/or security content, etc., associated with the array data stored in page 0.

The array structure illustrated in FIG. 2 is a logical array structure of memory array 130 usable by the external circuit. The address of data in the logical array structure (referred to as "logical address") can be mapped to the address of data in a physical array structure (referred to as "physical address") by scramble transfer. Thus, while the logical array structure of memory array 130 includes extra arrays 230 of reconfigurable size, the physical array structure of memory array 130 also can be remapped by scramble transfer to include such extra arrays 230.

Figures 3A, 3B:
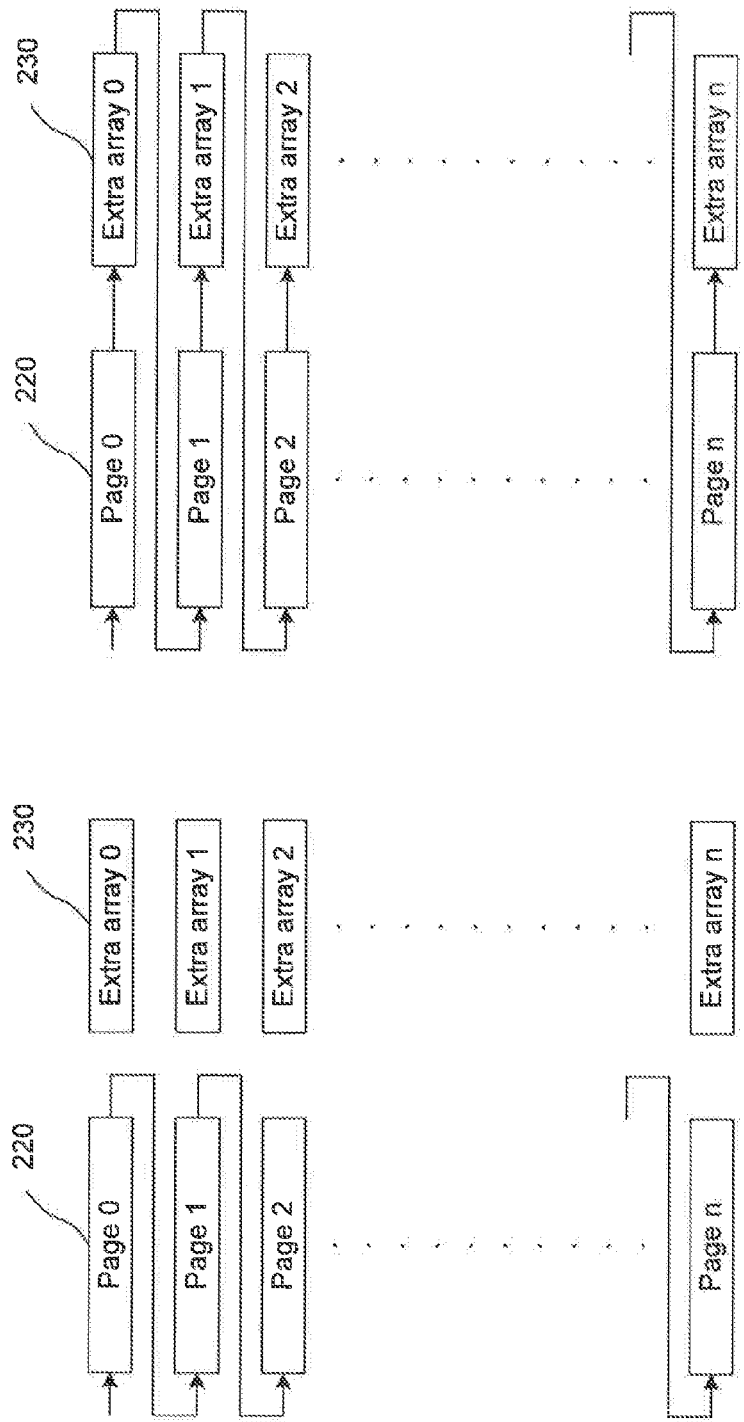
FIG. 3A schematically illustrates an access sequence of the memory array of FIG. 2, according to a first access mode of an illustrated embodiment.
FIG. 3B schematically illustrates an access sequence of the memory array of FIG. 2, according to a second access mode of an illustrated embodiment.

FIG. 3A schematically illustrates an access sequence of memory array 130, according to a first access mode of an illustrated embodiment. In the first access mode, only pages 220 are accessed sequentially in the order of page 0, page 1, page 2, . . . , page n. Extra arrays 230 are not accessed. The first access mode can be applied when the extra data stored in extra arrays 230 includes security content associated with the array data stored in pages 220.

FIG. 3B schematically illustrates another access sequence of memory array 130, according to a second access mode of an illustrated embodiment. In the second access mode, both of pages 220 and extra arrays 230 are accessed sequentially in the order of page 0, extra array 0, page 1, extra array 1, page 2, extra array 2, . . . , page n, extra array n.

In order to implement a read operation in the first access mode or the second access mode in memory device 100, several interface protocol methods can be used, according to different embodiments of the present disclosure. In some embodiments, logic unit 120 of memory device 100 can receive a read instruction that includes access information related to whether to perform a memory access operation in the first access mode or the second access mode. When logic unit 120 performs a read operation in the first access mode, logic unit 120 sequentially reads out the array data stored in pages 220 in the order of page 0, page 1, page 2, . . . , page n. The extra data stored in extra arrays 230 are excluded from the read out sequence. That is, the extra data stored in extra arrays 230 are not read out. When logic unit 120 performs a read operation in the second access mode, logic unit 120 sequentially reads out both the array data stored in pages 220 and the extra data stored in extra arrays in the order of page 0, extra array 0, page 1, extra array 1, page 2, extra array 2, . . . , page n, extra array n.

FIG. 4 schematically illustrates a read instruction 400 for performing a read operation, according to an illustrated embodiment. Read instruction 400 is issued to logic unit 120 in order to read data stored in memory array 130. As illustrated in FIG. 4, read instruction 400 includes a total of four (4) bytes, i.e., a first (1st) byte, a second (2nd) byte, a third (3rd) byte, and a fourth (4th) byte. The first (1st) byte includes a read command code, which can be pre-defined to instruct logic unit 120 to perform the read operation in the first access mode or in the second access mode, and, if in the second access mode, specify the size of each extra array 230. The second (2nd) byte includes a first address segment AD1, which includes address bits A23 to A16. The third (3rd) byte includes a second address segment AD2, which includes address bits A15 to A8. The fourth (4th) byte includes a third address segment AD3, which includes address bits A7 to A0. The address segments AD1, AD2, and AD3 constitute a 24-bit address, which represents a starting address in memory array 130 for the read operation. For example, a read command code of 03 in hexadecimal (hereinafter referred to as "03(hex)") can be pre-defined to instruct logic unit 120 to perform a read operation in the first access mode. When logic unit 120 receives an instruction including 03(hex) followed by a 24-bit address, logic unit 120 performs a read operation in the first access mode as illustrated in FIG. 3A, sequentially reading out the array data stored in pages 220 of memory array 130, starting from a location having the 24-bit address. As another example, a read command code of 66(hex) can be pre-defined to instruct logic unit 120 to perform a read operation in the second access mode, and to specify that the size of each extra array 230 is 2 bytes. When logic unit 120 receives an instruction including 66(hex) followed by a 24-bit address, logic unit 120 performs a read operation according to the second access mode as illustrated in FIG. 3B, sequentially reading out both the array data stored in pages 220 of memory array 130 and the extra data stored in the 2 bytes of each of extra arrays 230 of memory array 130, starting from a location having the 24-bit address. As still another example, a read command code of 68(hex) can be pre-defined to instruct logic unit 120 to perform a read operation in the second access mode, and to specify that the size of each extra array 230 is 4 bytes. When logic unit 120 receives an instruction including 68(hex) followed by a 24-bit address, logic unit 120 performs a read operation according to the second access mode as illustrated in FIG. 3B, sequentially reading out both the array data stored in pages 220 of memory array 130 and the extra data stored in the 4 bytes of each of extra arrays 230 of memory array 130, starting from a location having the 24-bit address.

FIG. 5 schematically illustrates a fast read instruction 500 for performing a fast read operation, according to an illustrated embodiment. Fast read instruction 500 is issued to logic unit 120 in order to quickly read the data stored in memory array 130. Compared to read instruction 400 of FIG. 4, fast read instruction 500 additionally includes a fifth (5th) byte, which is a dummy byte. The dummy byte provides an extra time margin required for sensing data. The read command code in the first byte can be pre-defined to instruct logic unit 120 to perform a fast read operation in the first access mode or the second access mode, and the size of each extra array 230. For example, a read command code of 0B(hex) can be pre-defined to instruct logic unit 120 to perform a fast read operation in the first access mode. When logic unit 120 receives an instruction including 0B(hex) followed by a 24-bit address and a dummy byte, logic unit 120 performs a fast read operation in the first access mode as illustrated in FIG. 3A, sequentially reading out the array data stored in pages 220 of memory array 130, starting from a location having the 24-bit address. As another example, a read command code of 67(hex) can be pre-defined to instruct logic unit 120 to perform a fast read operation in the second access mode, and to specify that the size of each extra array 230 is 2 bytes. When logic unit 120 receives an instruction including 67(hex) followed by a 24-bit address and a dummy byte, logic unit 120 performs a fast read operation in the second access mode as illustrated in FIG. 3B, sequentially reading out both the array data stored in pages 220 of memory array 130 and the extra data stored in the 2 bytes of each of extra arrays 230 of memory array 130, starting from a location having the 24-bit address.

Figure 6:
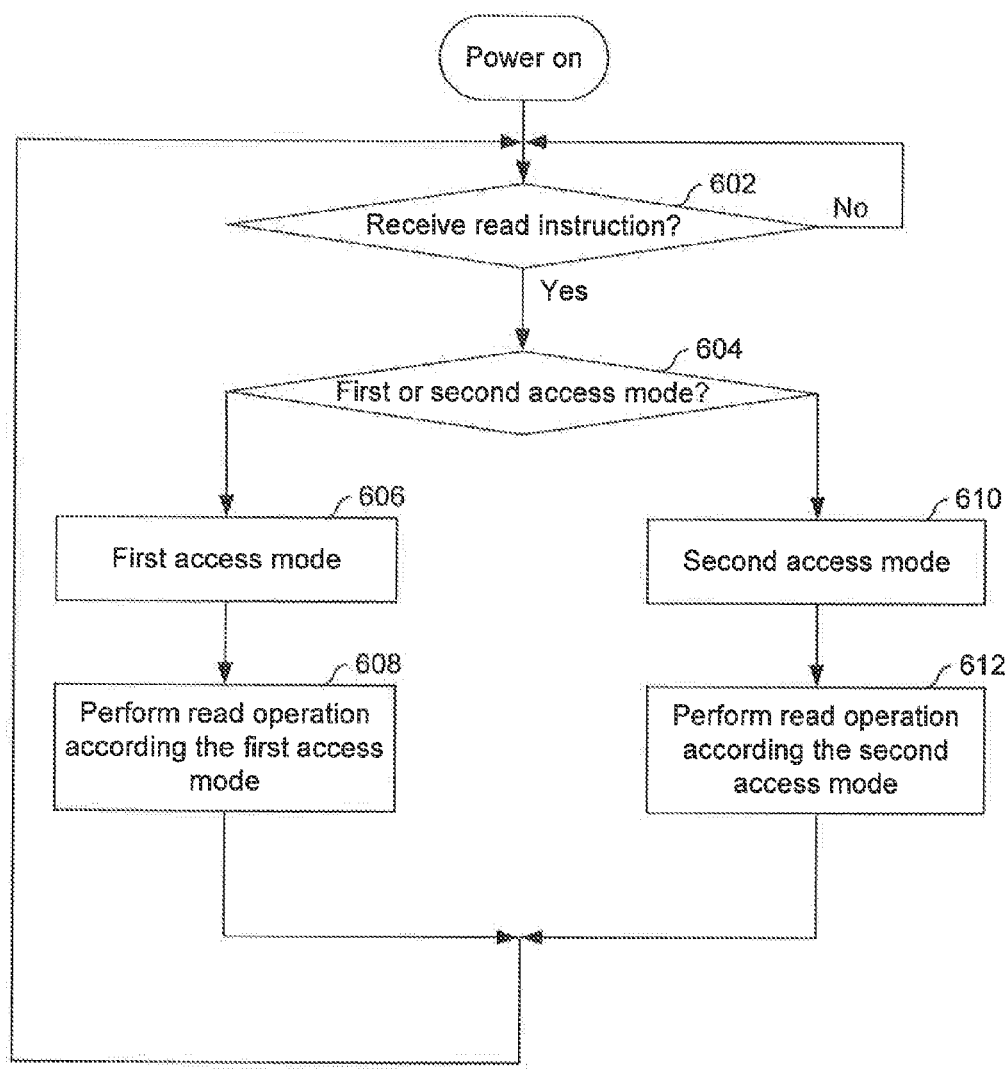
FIG. 6 is a flowchart illustrating a read process performed by a logic unit, according to an illustrated embodiment.

FIG. 6 is a flowchart illustrating a read process performed by logic unit 120, according to an illustrated embodiment. When memory device 100 is powered on, logic unit 120 determines whether a read instruction is received (step 602). If a read instruction is not received (step 602: No), logic unit 120 repeats step 602 periodically until a read instruction is received. If a read instruction is received (step 602: Yes), logic unit 120 analyzes the received read instruction to determine whether the read instruction specifies the first access mode or the second access mode (step 604). For example, logic unit 120 determines whether a read command code in the read instruction is 03(hex) or 66(hex). If the read command code is 03(hex), logic unit 120 determines that the read instruction specifies the first access mode (step 606). As a result, logic unit 120 performs a read operation in the first access mode (step 608). If the read command code is 66(hex), logic unit 120 determines that the read instruction specifies the second access mode (step 610). As a result, logic unit 120 performs a read operation in the second access mode (step 612). Afterwards, logic unit 120 returns to step 602 to determine whether a read instruction is received.

Figure 7:
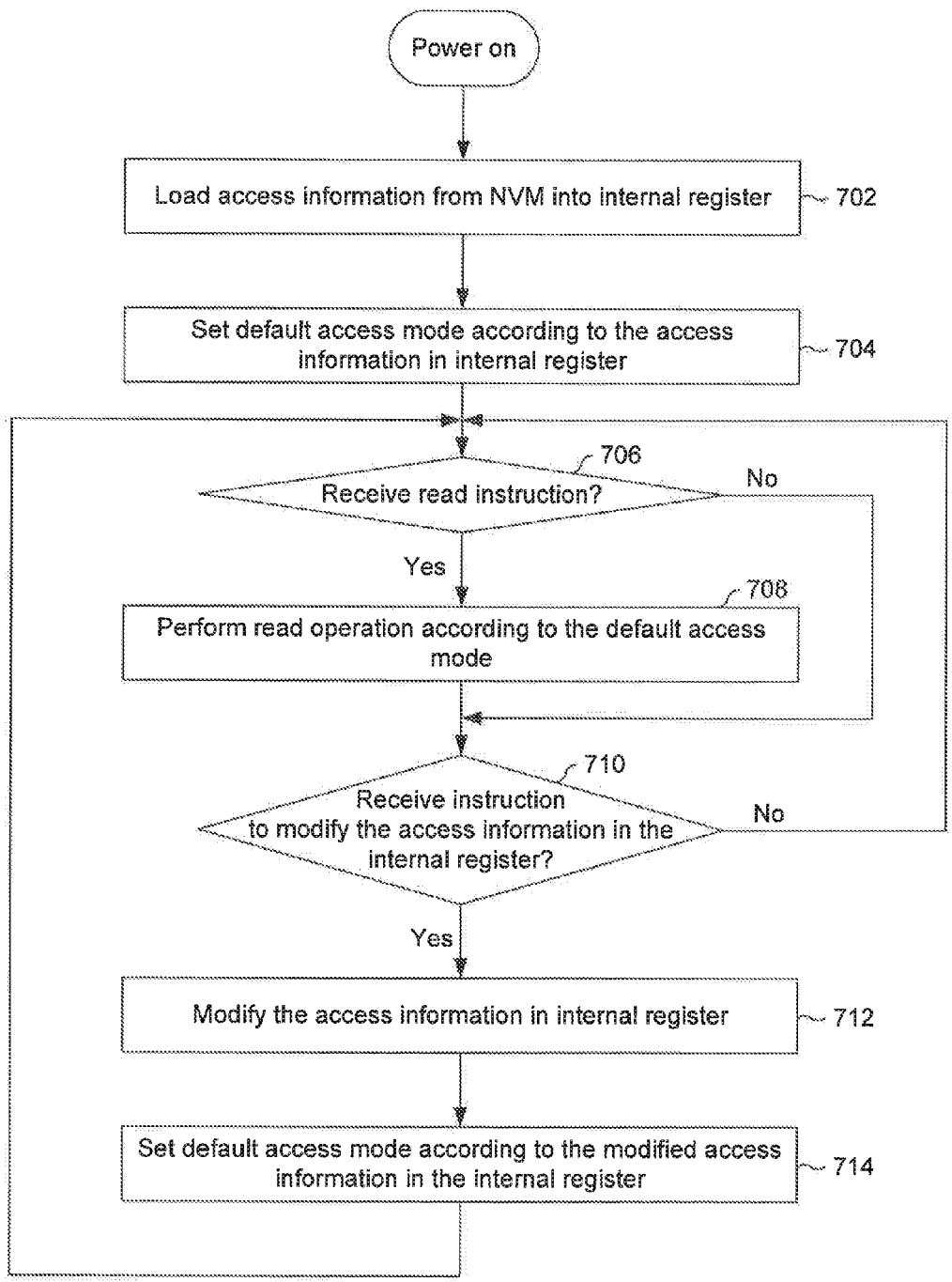
FIG. 7 is a flowchart illustrating a read process performed by the logic unit, according to another illustrated embodiment.

In some embodiments, logic unit 120 can store, in non-volatile memory 140, access information related to whether to perform a memory access operation in the first access mode or in the second access mode, and the size of each extra array 230. FIG. 7 is a flowchart illustrating a read process performed by logic unit 120, according to such an embodiment.

Referring to FIG. 7, when memory device 100 is powered on, logic unit 120 loads the access information from non-volatile memory 140 into internal register 124 of logic unit 120 (step 702). Logic unit 120 then sets its default access mode according to the access information in internal register 124 (step 704). For example, when the access information in internal register 124 indicates the first access mode as illustrated in FIG. 3A, logic unit 120 sets its default access mode as the first access mode. As another example, when the access information in internal register 124 indicates the second access mode as illustrated in FIG. 3B and the size of extra array 230 is 2 bytes, logic unit 120 sets its default access mode as the second access mode with an extra array size of 2 bytes.

Logic unit 120 determines whether a read instruction is received (step 706). If a read instruction is not received (step 706: No), logic unit 120 directly moves to step 710. If a read instruction is received (step 706: Yes), logic unit 120 performs a read operation according to the default access mode (step 708).

Because internal register 124 already contains the access information as to whether to perform an operation in the first access mode or in the second access mode, it is not necessary for the read instruction in this embodiment to specify whether to perform the read operation in the first access mode or in the second access mode. Logic unit 120 then determines whether an instruction to modify the access information in internal register 124 is received (step 710). If an instruction to modify the access information in internal register 124 is not received (step 710: No), logic unit 120 returns to step 706 to determine whether a read instruction is received. If an instruction to modify the access information in internal register 124 is received (step 710: Yes), logic unit 120 modifies the access information according to the received instruction (step 712). Logic unit 120 then sets its default access mode according to the modified access information in Internal register 124 (step 714). For example, when the received instruction in step 710 instructs logic unit 120 to modify the access information to change the first access mode to the second access mode, logic unit 120 sets the default access mode as the second access mode in internal register 124. Afterwards, logic unit 120 returns to step 706 to determine whether a read instruction is received.

In some embodiments, in order to implement a program operation in the first access mode or the second access mode, logic unit 120 of memory device 100 can receive a program instruction that include access information related to whether to perform a program operation in the first access mode or the second access mode.

FIG. 8A schematically illustrates a page program instruction 800 for performing a page program operation, i.e., for programming a page, in the first access mode, according to an illustrated embodiment. In this embodiment, it is assumed that each page 220 has a fixed size of 256 bytes. As illustrated in FIG. 8A, page program instruction 800 includes a total of 260 bytes. The first (1st) byte includes a page program command code, which can be pre-defined to instruct logic unit 120 to perform the page program operation in the first access mode. The second (2nd) through fourth (4th) bytes include address segments AD1, AD2, and AD3, respectively. The address segments AD1, AD2, and AD3 constitute a 24-bit address, which represents a location of a selected page to be programmed. The fifth (5th) through 260th byte Include 256 bytes of array data to be programmed into the selected page. For example, a page program command code of 02(hex) can be pre-defined to instruct logic unit 120 to perform a page program operation in the first access mode. When logic unit 120 receives an instruction including 02(hex) followed by a 24-bit address and 256 bytes of data, logic unit 120 performs a page program operation in the first access mode, programming the 256 bytes of data into a page of memory array 130 having the 24-bit address.

FIG. 8B schematically illustrates a page program instruction 810 for performing a page program operation in the second access mode, according to an illustrated embodiment. In this embodiment, it is assumed that each page 220 has a size of 256 bytes, and each extra array 230 has a size of 8 bytes. As illustrated in FIG. 8B, page program instruction 810 includes a total of 268 bytes. The first (1st) byte is a page program command code, which can be pre-defined to instruct logic unit 120 to perform the page program operation in the second access mode. The second (2nd) through fourth (4th) bytes include address segments AD1, AD2, and AD3, respectively. The address segments AD1, AD2, and AD3 constitute a 24-bit address, which represents a location of a selected page 220 to be programmed. The fifth (5th) through 260th byte include 256 bytes of array data to be programmed into the selected page 220. The 261st through 268th byte include 8 bytes of extra array data to be programmed into an extra array 230 following the selected page 220. For example, a page program command code of 37(hex) can be pre-defined to indicate that the page program operation is performed in the second access mode, and that the size of each extra array 230 is 8 bytes. When logic unit 120 receives an instruction including 37(hex) followed by a 24-bit address and 264 bytes of data, logic unit 120 performs a page program operation in the second access mode, programming the first 256 bytes of the received data into a selected page 220 of memory array 130 having the 24-bit address, and programming the remaining 8 bytes of data into an extra array 230 corresponding to the selected page 220.

Figure 9:
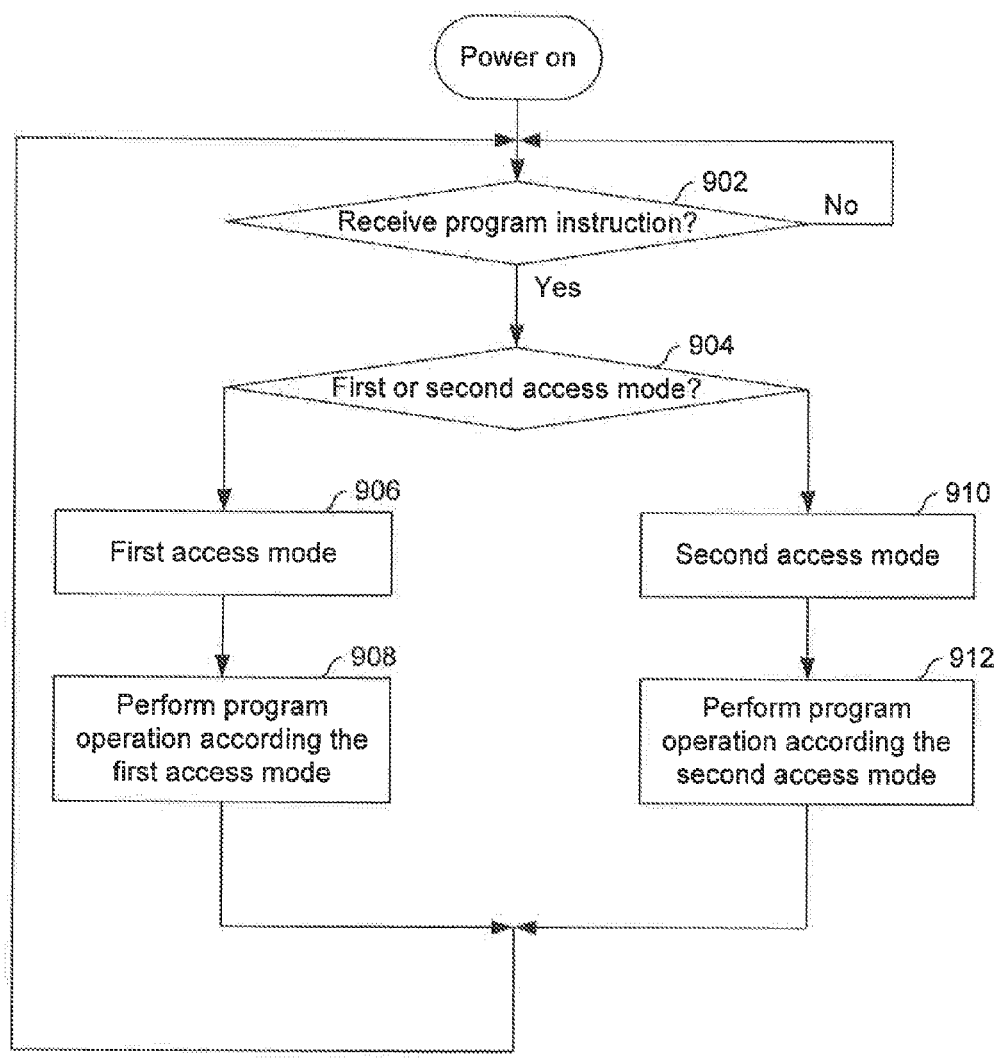
FIG. 9 is a flowchart illustrating a program process performed by the logic unit, according to an illustrated embodiment.

FIG. 9 is a flowchart illustrating a program process performed by logic unit 120, according to an illustrated embodiment. When memory device 100 is powered on, logic unit 120 determines whether a program instruction is received (step 902). If a program instruction is not received (step 902: No), logic unit 120 repeats step 902 periodically until a program instruction is received. If a program instruction and data to be programmed are received (step 902: Yes), logic unit 120 analyzes the received program instruction to determine whether the program instruction specifies the first access mode or the second access mode (step 904). For example, logic unit 120 determines whether a program command code in the read instruction is 02(hex) or 37(hex). If the program command code is 02(hex), logic unit 120 determines that the program instruction specifies the first access mode (step 906). As a result, logic unit 120 performs a program operation in the first access mode (step 908). If the program command code is 37(hex), logic unit 120 determines that the received program instruction specifies the second access mode (step 910). As a result, logic unit 120 performs a program operation in the second access mode (step 912). Afterwards, logic unit 120 returns to step 902 to determine whether a program instruction is received.

Figure 10:
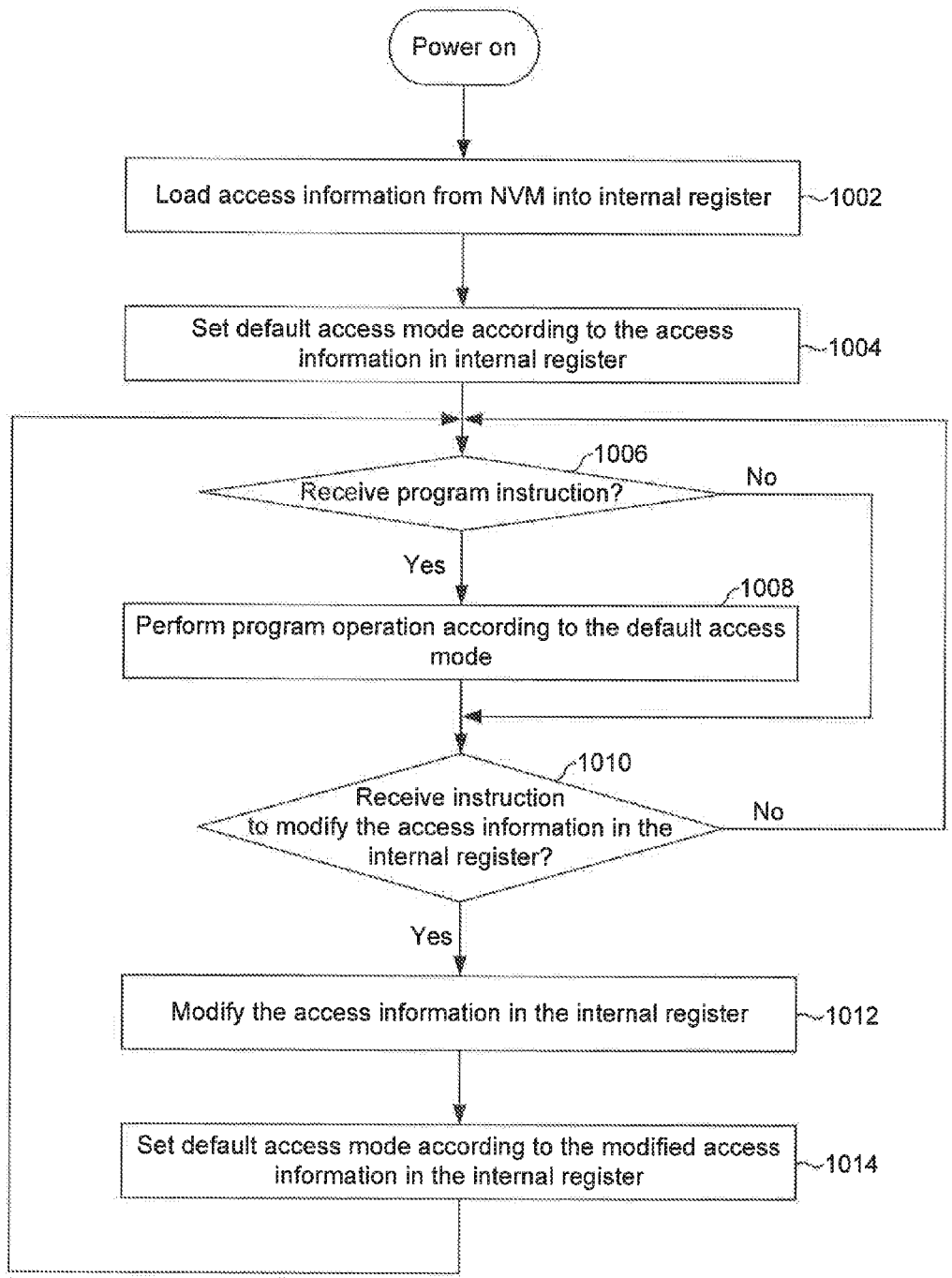
FIG. 10 is a flowchart illustrating a program process performed by the logic unit, according to another illustrated embodiment.

In some embodiments, logic unit 120 can perform a program operation according to the access information stored in non-volatile memory 140 and loaded in internal register 124. FIG. 10 is a flowchart illustrating a program process performed by logic unit 120, according to such an embodiment.

Referring to FIG. 10, when memory device 100 is powered on, logic unit 120 loads the access information from non-volatile memory 140 into internal register 124 of logic unit 120 (step 1002). Logic unit 120 then sets its default access mode according to the access information in internal register 124 (step 1004). Logic unit 120 determines whether a program instruction is received (step 1006). If a program instruction is not received (step 1006: No), logic unit 120 directly move to step 1010. If a program instruction is received (step 1006: Yes), logic unit 120 performs a program operation according to the default access mode (step 1008). Because internal register 124 already contains the access information as to whether to perform an operation in the first access mode or in the second access mode, it is not necessary for the program instruction in this embodiment to specify whether to perform the program operation in the first access mode or in the second access mode. Logic unit 120 then determines whether an instruction to modify the access information in internal register 124 is received (step 1010). If an instruction to modify the access information in internal register 124 is not received (step 1010: No), logic unit 120 returns to step 1006 to determine whether a read instruction is received. If an instruction to modify the access information in internal register 124 is received (step 1010: Yes), logic unit 120 modifies the access information according to the received instruction (step 1012). Logic unit 120 then sets its default access mode according to the modified access information in internal register 124 (step 1014). Afterwards, logic unit 120 returns to step 1006 to determine whether a program instruction is received.

In some embodiments, in order to implement an erase operation in memory device 100 including array blocks 200 and extra array blocks 210, logic unit 120 of memory device 100 can receive an erase instruction that includes information related to whether to erase a selected array block 200, or to erase a selected extra array block 210, or to erase both a selected array block 200 and a corresponding extra array block 210. FIG. 11 schematically illustrates an erase instruction 1100 for performing an erase operation, according to such an embodiment.

As illustrated in FIG. 11, erase instruction 1100 includes a total of four (4) bytes, i.e., a first (1st) byte, a second (2nd) byte, a third (3rd) byte, and a fourth (4th) byte. The first (1st) byte includes an erase command code, which can be pre-defined to instruct logic unit 120 to perform an erase operation to erase a selected array block 200, or to erase a selected extra array block 210, or to erase both a selected array block 200 and its corresponding extra array block 210. The second (2nd) through fourth (4th) bytes include address segments AD1, AD2, and AD3, respectively. The address segments AD1, AD2, and AD3 constitute a 24-bit address, which represents a location of a block to be erased. For example, an erase command code of 52(hex) can be pre-defined to instruct logic unit 120 to perform an erase operation to erase a selected array block 200. When logic unit 120 receives an instruction including 52(hex) followed by a 24-bit address, logic unit 120 performs an erase operation to erase an array block 200 having the 24-bit address. As another example, an erase command code of 53(hex) can be pre-defined to instruct logic unit 120 to perform an erase operation to erase a selected extra array block 210. When logic unit 120 receives an instruction including 53(hex) followed by a 24-bit address, logic unit 120 performs an erase operation to erase an extra array block 210 having the 24-bit address. As still another example, an erase command code of 54(hex) can be pre-defined to instruct logic unit 120 to perform an erase operation to erase both a selected array block 200 and its corresponding extra array block 210. When logic unit 120 receives an instruction including 54(hex) followed by a 24-bit address, logic unit 120 performs an erase operation to erase an array block 200 having the 24-bit address, and an extra array block 210 corresponding to the array block 200 having the 24-bit address.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A memory device, comprising:
 a memory array including a plurality of pages for storing array data and a plurality of extra arrays respectively corresponding to the plurality of pages for storing extra data;

a non-volatile memory storing access information that specifies whether to perform a memory access operation in a first access mode or a second access mode; and a logic unit coupled to the memory array and the non-volatile memory, wherein in the first access mode, the logic unit accesses the array data stored in the plurality of pages, and in the second access mode, the logic unit accesses the array data stored in the plurality of pages and the extra data stored in the plurality of extra arrays.

2. The memory device of claim 1, wherein the logic unit is configured to:

receive a read instruction, and perform a read operation in the first access mode or in the second access mode; and wherein the read instruction specifies whether to perform the read operation in the first access mode or the second access mode.

3. The memory device of claim 2, wherein the read instruction includes a read command code and a starting address for the read operation, and the read command code is one of a first read command code that specifies the first access mode, and a second read command code that specifies the second access mode and a size of each one of the plurality of extra arrays.

4. The memory device of claim 3, wherein the logic unit is configured to:

determine whether the read command code included in the read instruction is the first read command code or the second read command code;

if the read command code is determined to be the first read command code, perform the read operation in the first access mode; and if the read command code is determined to be the second read command code, perform the read operation in the second access mode.

5. The memory device of claim 1, wherein the logic unit includes an internal register, and the logic unit is configured to:

load the access information from the non-volatile memory to the internal register; and set a default access mode according to the access information in the internal register.

6. The memory device of claim 5, wherein the logic unit is configured to:

perform a read operation in the default access mode.

7. The memory device of claim 5, wherein the logic unit is configured to:

receive an instruction to modify the access information in the internal register;

modify the access information in the internal register according to the received instruction; and set the default access mode according to the modified access information.

8. The memory device of claim 5, wherein the logic unit is configured to:

receive a program instruction including an address of a selected page and data to be programmed; and perform a program operation in the default access mode.

9. The memory device of claim 1, where in the logic unit is configured to:

receive a program instruction including an address of a selected page and data to be programmed;

perform a program operation in the first access mode or in the second access mode, wherein in the first access mode, the logic unit programs the received data in the selected page, and in the second access mode, the logic unit programs the received data in the selected page and the extra array corresponding to the selected page.

10. The memory device of claim 9, wherein the program instruction includes a program command code, and the program command code is one of a first program command code that specifies the first access mode, and a second program command code that specifies the second access mode and the size of each one of the plurality of extra arrays.

11. The memory device of claim 10, wherein the logic unit is configured to:

determine whether the program command code included in the program instruction is the first program command code or the second program command code;

if the program command code is determined to be the first program command code, perform the program operation in the first access mode; and if the program command code is determined to be the second program command code, perform the program operation in the second access mode.

12. The memory device of claim 1, wherein the logic unit is configured to:

receive an erase instruction including an address;

determine whether the erase instruction specifies erasing an array block having the address, or erasing an extra array block having the address, or erasing an array block and a corresponding extra array having the address; and perform an erase operation based on the determination.

13. A memory device, comprising:

a memory array including a plurality of pages for storing array data and a plurality of extra arrays respectively corresponding to the plurality of pages for storing extra data;

a non-volatile memory storing access information that specifies whether to perform a memory access operation in a first access mode or a second access mode; and a logic unit coupled to the memory array and the non-volatile memory, wherein in the first access mode, the logic unit accesses a selected page, and in the second access mode, the logic unit accesses the selected page and one of the extra arrays corresponding to the selected page.

14. The memory device of claim 13, wherein the logic unit is configured to:

receive a program instruction, and perform a program operation in the first access mode or in the second access mode; and wherein the program instruction specifies whether to perform the program operation in the first access mode or the second access mode.

15. The memory device of claim 14, wherein the program instruction includes a program command code, and the program command code is one of a first program command code that specifies the first access mode, and a second program command code that specifies the second access mode and the size of each one of the plurality of extra arrays.

16. The memory device of claim 15, wherein the logic unit is configured to:

determine whether the program command code included in the program instruction is the first program command code or the second program command code;

if the program command code is determined to be the first program command code, perform the program operation in the first access mode; and if the program command code is determined to be the second program command code, perform the program operation in the second access mode.

17. The memory device of claim 13, wherein the logic unit includes an internal register, and
the logic unit is configured to:
    load the access information from the non-volatile memory to the internal register;
    set a default access mode according to the access information in the internal register; and
    perform the program operation according to the default access mode.

18. The memory device of claim 17, wherein the logic unit is configured to:
    receive an instruction to modify the access information in the internal register;
    modify the access information in the internal register according to the received instruction; and
    set the default access mode according to the modified access information.

19. A method of operating a memory device,
the memory device including:
    a memory array including a plurality of array blocks for storing array data and a plurality of extra array blocks respectively corresponding to the plurality of array blocks for storing extra data;
    a non-volatile memory storing access information that specifies whether to perform a memory access operation in a first access mode or a second access mode; and
    a logic unit coupled to the memory array and the non-volatile memory,
the method comprising:
    determining, by the logic unit, whether to access the memory array in the first access mode or the second access mode based on the access information stored in the non-volatile memory;
    if the access information stored in the non-volatile memory specifies the first access mode, accessing, by the logic unit, the array data stored in the plurality of pages; and
    if the access information stored in the non-volatile memory specifies the second access mode, accessing, by the logic unit, the array data stored in the plurality of pages and the extra data stored in the plurality of extra arrays.

* * * * *